United States Patent
Ziari et al.

(10) Patent No.: US 8,964,284 B2
(45) Date of Patent: Feb. 24, 2015

(54) BANDED SEMICONDUCTOR OPTICAL AMPLIFIER

(75) Inventors: Mehrdad Ziari, Pleasanton, CA (US);
Scott Corzine, Sunnyvale, CA (US);
Masaki Kato, Palo Alto, CA (US);
Michael Francis Van Leeuwen, Bethesda, MD (US); Radhakrishnan L. Nagarajan, Cupertino, CA (US);
Matthew L. Mitchell, Monte Sereno, CA (US); Fred A. Kish, Jr., Palo Alto, CA (US)

(73) Assignee: Infinera Corporation, Sunnyvale, CA (US)

(*) Notice: Subject to any disclaimer, the term of this patent is extended or adjusted under 35 U.S.C. 154(b) by 103 days.

(21) Appl. No.: 13/449,515

(22) Filed: Apr. 18, 2012

(65) Prior Publication Data

US 2013/0279910 A1 Oct. 24, 2013

(51) Int. Cl.
*H04S 5/00* (2006.01)

(52) U.S. Cl.
USPC .......................... 359/344; 359/349

(58) Field of Classification Search
USPC ................................. 359/344, 349
See application file for complete search history.

(56) References Cited

U.S. PATENT DOCUMENTS

| | | | | |
|---|---|---|---|---|
| 4,923,291 A * | 5/1990 | Edagawa et al. | | 359/334 |
| 5,852,687 A * | 12/1998 | Wickham | | 385/14 |
| 6,400,864 B1 * | 6/2002 | Lee | | 385/24 |
| 6,560,010 B1 * | 5/2003 | DiJaili et al. | | 359/344 |
| 7,002,733 B2 * | 2/2006 | Dagenais et al. | | 359/337 |
| 7,010,198 B2 * | 3/2006 | Wessel | | 385/40 |
| 7,035,491 B2 * | 4/2006 | Little | | 385/11 |
| 7,126,747 B2 * | 10/2006 | Lee | | 359/334 |
| 7,626,757 B2 * | 12/2009 | Iannone et al. | | 359/334 |
| 2005/0095741 A1 * | 5/2005 | Johnstone et al. | | 438/31 |

* cited by examiner

*Primary Examiner* — Eric Bolda
(74) *Attorney, Agent, or Firm* — Harrity & Harrity LLP; David L. Stoltz (57) ABSTRACT

A semiconductor optical amplifier module may include a beam splitter to split an optical signal into two polarization optical signals including a first polarization optical signal with a Transverse Magnetic (TM) polarization provided along a first path of two paths, and a second polarization optical signal with a Transverse Electric (TE) polarization provided along a second path of the two paths; a first rotator to rotate the TM polarization of the first polarization optical signal to TE polarization; a first semiconductor optical amplifier to amplify the rotated first polarization optical signal to output a first resultant optical signal; a second semiconductor optical amplifier to amplify the second polarization optical signal; and a second rotator to rotate the polarization of the amplified second polarization optical signal to output a second resultant optical signal; and a beam combiner to combine the first resultant optical signal and the second resultant optical signal.

12 Claims, 4 Drawing Sheets

BANDED SEMICONDUCTOR OPTICAL AMPLIFIER

BACKGROUND

Wavelength-Division Multiplexing (WDM) systems are known in which optical signals, each modulated to carry a different information stream and each having a different wavelength, are combined into a WDM signal and transmitted on an optical communication path including one or more segments of optical fiber, for example. Such WDM signals have greater capacity than systems in which a single modulated optical signal having a single wavelength is transmitted. Further information carrying capacity can be achieved by transmitting different polarization components or portions of each signal that are modulated independently of each other to carry separate data streams. For example, one component of the optical signal may have a transverse electric (TE) polarization and another component of the optical signal may have a transverse magnetic (TM) polarization that is oriented orthogonal to the TE polarization. By separately modulating and combining (or multiplexing) TE and TM polarized optical components at each wavelength, the information carrying capacity can be doubled compared to a WDM system that transmits optical signals having a single polarization at each wavelength. WDM systems in which each optical signal has combined TE and TM optical components are often referred to as Polarization Multiplexed (PM) WDM systems.

Typically, optical signals transmitted in a PM WDM system are attenuated as the optical signals propagate along the optical fiber. In order to compensate or offset such attenuation, the power level of the optical signals may be boosted or increased by optical amplifiers provided at periodic locations along the optical communication path. Typically, the gain imparted to each optical signal, as well as each polarization component (TE and TM) of each optical signal, should preferably be the same. Otherwise, those optical signals and polarization components experiencing increased gain will be amplified more at each amplifier site than those experiencing less gain. The power of such high gain optical signals and polarization components will increase at each successive amplifier, while the power associated with the low gain optical signals and polarization components will decrease at each amplifier site. After propagating through several amplifiers, most of the amplification will be imparted to the high gain optical signals and polarization components, while the low gain optical signals and polarization components will be attenuated and indistinguishable from a background noise level when supplied to an optical receiver.

Although capacity gains have been realized with PM WDM systems, further capacity increases may be required. Such capacity increases may be realized by providing further polarization multiplexed optical signals at additional wavelengths. There is a need, however, to adequately or uniformly amplify each of the optical signals in such high capacity systems. Further, there is a need to provide such amplification with an amplifier having a compact design.

SUMMARY

According to one or more possible implementations, an optical amplifier may include a substrate and a wavelength band splitter on the substrate. The wavelength band splitter may be configured to split an optical signal into multiple banded optical signals of particular wavelength bands.

The optical amplifier may also include multiple semiconductor optical amplifier (SOA) modules on the substrate. Each of the multiple SOA modules may be configured to amplify one of the multiple banded optical signals, of the particular wavelength bands from the wavelength band splitter, into an amplified banded optical signal. Each of the multiple SOA modules may include a polarized beam splitter configured to split the one of the multiple banded optical signals into two polarization optical signals. The two polarization optical signals may include a first polarization optical signal provided along a first path of two separate optical paths, and a second polarization optical signal provided along the second path of the two separate optical paths.

Each of the multiple SOA modules may also include a first rotator along the first path. The first rotator may be configured to rotate the polarization of the first polarization optical signal to obtain a rotated first polarization optical signal.

Each of the multiple SOA modules may also include a first SOA configured to amplify the rotated first polarization optical signal to obtain an amplified first polarization optical signal. Each of the multiple SOA modules may also include a first variable optical attenuator configured to adjust a power level, a phase, and/or an amplitude level of the amplified first polarization optical signal to output a first resultant optical signal.

Each of the multiple SOA modules may also include a second SOA configured to amplify the second polarization optical signal to obtain an amplified second polarization optical signal. Each of the multiple SOA modules may also include a second variable optical attenuator configured to adjust a power level, a phase, and/or an amplitude level of the amplified second polarization optical signal to obtain an adjusted second polarization optical signal. Each of the multiple SOA modules may also include a second rotator along the second path. The second rotator may be configured to rotate the polarization of the adjusted amplified second polarization optical signal to output a second resultant optical signal.

Each of the multiple SOA modules may also include a polarized beam combiner configured to combine the first resultant optical signal and the second resultant optical signal into the amplified banded optical signal. Each of the multiple SOA modules may also include a wavelength band combiner on the substrate. The wavelength band combiner may be configured to combine the amplified banded optical signals from each of the multiple SOA modules into an amplified optical signal.

According to one or more possible implementations, an SOA module may include a beam splitter configured to split an optical signal into two polarization optical signals to provide along two paths. The two polarization optical signals may be split into a first polarization optical signal with a Transverse Magnetic (TM) polarization provided along a first path of the two paths, and a second polarization optical signal with a Transverse Electric (TE) polarization provided along a second path of the two paths.

The SOA module may also include a first rotator along the first path. The first rotator may be configured to rotate the TM polarization of the first polarization optical signal to TE polarization. The SOA module may also include a first SOA along the first path, the first SOA configured to amplify the rotated first polarization optical signal with TE polarization to output a first resultant optical signal. The SOA module may also include a second SOA along the second path, the second SOA may be configured to amplify the second polarization optical signal with TE polarization.

The SOA module may also include a second rotator along the second path. The second rotator may be configured to rotate the polarization of the amplified second polarization optical signal to output a second resultant optical signal with TM polarization. The SOA module may also include a beam combiner configured to combine the first resultant optical signal with TE polarization from the first path and the second resultant optical signal with TM polarization from the second path into the optical signal with amplification.

According to one or more possible implementations, an optical system may include multiple transmitters configured to transmit multiple transmitted optical signals. The optical system may also include a multiplexer configured to receive and combine the multiple transmitted optical signals into a multiplexed optical signal. The optical system may also include multiple banded SOAs configured to amplify the multiplexed optical signal.

One of the multiple banded SOAs may include a wavelength band splitter. The wavelength band splitter may be configured to split the multiplexed optical signal into multiple banded optical signals of particular wavelength bands. Each of the banded SOAs may also include multiple modules configured to communicate with the wavelength band splitter and receive at least one of the multiple banded optical signals.

Each of the multiple modules may be configured to amplify one of the multiple banded optical signals of the particular wavelength bands from the wavelength band splitter into an amplified banded optical signal.

One of the multiple modules may include a polarized beam splitter to split one of the multiple banded optical signals into a pair of polarized optical signals. The one of the multiple modules may also include multiple SOAs each of which is configured to amplify an optical signal of the pair of polarized optical signals.

The one of the multiple modules may also include multiple rotators. Each rotator may be configured to rotate an optical signal of the pair of polarized optical signals. The one of the multiple modules may also include a polarized beam combiner to combine the pair of amplified and rotated polarized optical signals into the amplified banded optical signal.

The one of the multiple modules may also include a wavelength band combiner on the substrate. The wavelength band combiner may be configured to combine the amplified banded optical signals from each of the multiple modules into an amplified multiplexed optical signal.

The optical system may also include a demultiplexer. The demultiplexer may be configured to decombine the amplified multiplexed optical signal into multiple amplified demultiplexed optical signals. The optical system may also include multiple receivers configured to receive multiple amplified demultiplexed optical signals.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Consistent with the present disclosure, a high capacity WDM optical signal includes groupings of optical signals that have wavelengths within given bands (e.g., known C-, L-, S-, O-, E-, and U-bands, etc.). In order to offset optical signal losses as the WDM optical signal propagates along an optical communication path, the optical signal may be supplied to an optical amplifier. Preferably, the optical amplifier includes an optical decombiner or demultiplexer to separate and supply each band to a corresponding amplifier module. In each module, the TE and TM polarization components of the optical signals in a given band are separated by a polarization beam splitter (PBS), such that the TE components are supplied to a first branch or path and the TM components are supplied to a second branch or path. Along each branch or path, a semiconductor optical amplifier may be provided in order to amplify the polarization components (either TE or TM). Other optical devices may be included in each path, such as a polarization rotator and variable optical attenuator. Preferably, the number of optical devices in each branch is the same, so that each polarization component experiences the same level of gain, attenuation and/or optical loss.

The amplified TE and TM components within each optical signal group (wavelength band) may then be combined with a polarization beam combiner and output from the amplifier module. The outputs from each module are then combined by an optical combiner or multiplexer and supplied to the optical communication path.

The devices included in each optical module may be integrated on a common substrate, and, in one implementation, each module is provided on a substrate. Accordingly, an amplifier consistent with the present disclosure may take up less space and have increased reliability than that associated with optical amplifiers including discrete components. Each module and the devices included in each module, however, may be provided as discrete devices. Moreover, an optical amplifier consistent with the present disclosure can provide substantially uniform gain over a range of wavelengths greater than that achievable by conventional erbium doped fiber amplifiers. Such uniform gain may be achieved, for example, by appropriate biasing of the SOAs in each module. Further, the polarization component output from each branch preferably has substantially the same power, and each optical signal of each band typically has the substantially same power. As a result, each optical signal has sufficient power and can be adequately detected by a receiver.

The following detailed description refers to the accompanying drawings. The same reference numbers in different drawings may identify the same or similar elements.

Figure 1:
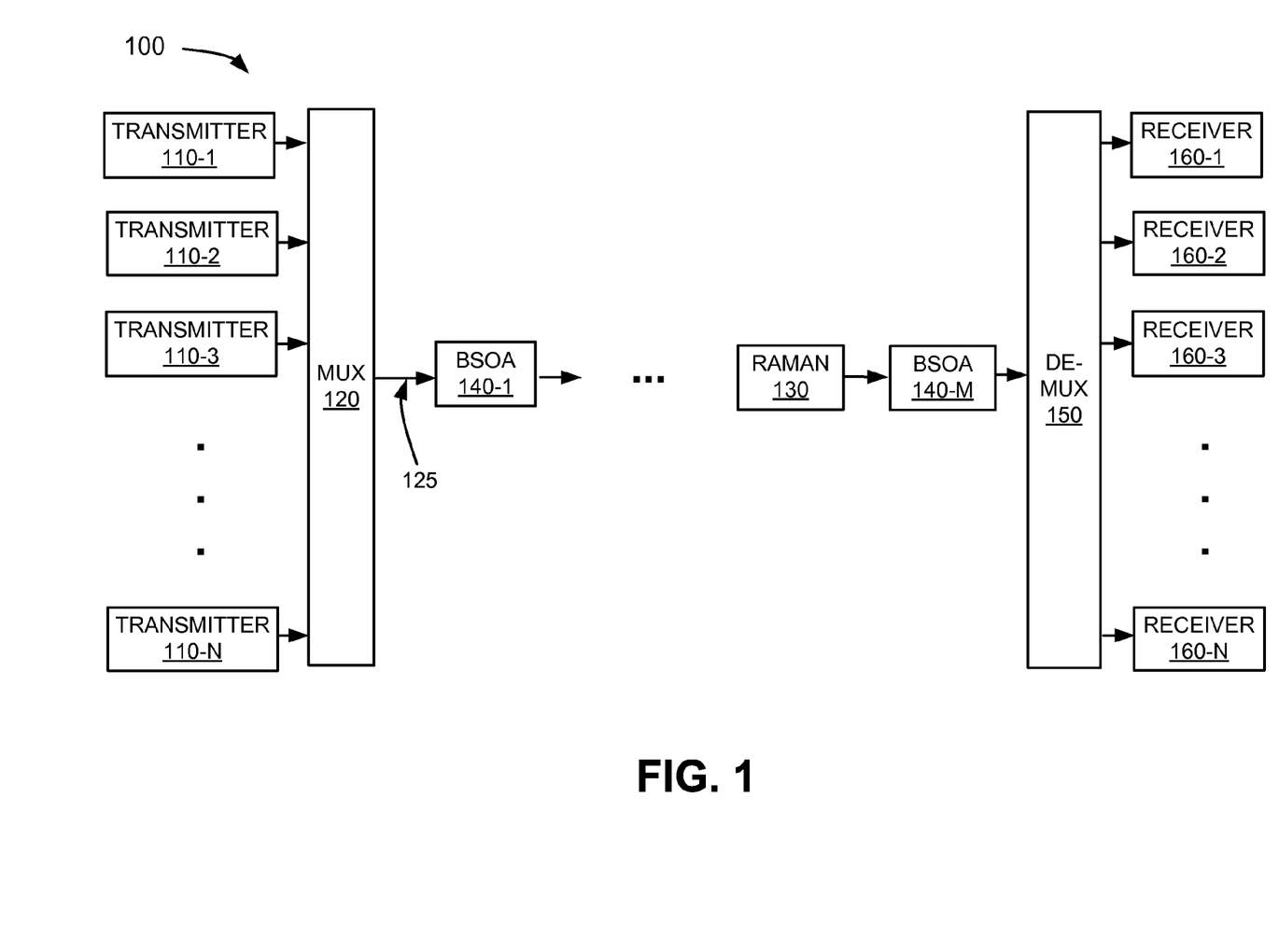
FIG. 1 is a diagram of an example optical system in which systems and/or methods, described herein, may be implemented.

FIG. 1 is a diagram of an example optical system 100 in which systems and/or methods described herein may be implemented. While FIG. 1 shows a particular number and arrangement of components, optical system 100 may include additional, fewer, different, or differently arranged components than those illustrated in FIG. 1.

As shown in FIG. 1, optical system 100 may include multiple transmitters 110, multiplexer 120, optical communication path 125, Raman amplifier 130, multiple banded SOAs 140-1 to 140-M (BSOAs, the BSOAs may be referred to herein individually and collectively as BSOAs 140), demultiplexer 150, and multiple receivers 160.

Transmitters 110 may include optical sources, such as lasers. Transmitters 110 can include multiple transmitters 110-1 through 110-N (N>1). Each of transmitters 110-1 through 110-N can receive a corresponding one of multiple data or information streams. Transmitters 110-1 to 110-N may output optical signals or channels, including multiple wavelengths and multiple polarizations, to multiplexer 120. An exemplary transmitter is described in U.S. patent application Ser. No. 12/981,835 filed on Dec. 30, 2010, the entire contents of which are incorporated herein by reference.

Multiplexer 120 (e.g., MUX) may include an optical combiner, an Arrayed Waveguide Grating (AWG), and/or one or more optical filters. Multiplexer 120 may combine optical signals with various wavelengths and polarizations from transmitters 110 into a multiplexed optical signal that is output to optical communication path 125 and transmitted to demultiplexer 150.

Optical communication path 125 may include an optical transmission fiber or a series of segments of such fiber. The optical transmission fiber may be silica based or may include other known optical fibers suitable for optical communications.

Optical communication path 125 may extends over a relatively long distance, such as hundreds or thousands of kilometers, over which optical signals may attenuate, as discussed above. Accordingly, optical communication path 125 may include Raman amplifier 130 and/or one or more BSOAs 140 to amplify the optical signals and compensate for signal loss. Additionally, Raman amplifier 130 and/or one or more banded SOAs 140 may be located anywhere along optical communication path 125 and in any order. For example, Raman amplifier 130 may be located closer to multiplexer 120 than the BSOAs 140. Alternatively, multiple BSOAs 140 may be spaced from one another at intervals along optical communication path 125 with one Raman amplifier 130 located near to demultiplexer 150.

Raman amplifier 130 can include one or more Raman pump lasers (e.g., Raman pumps) that impart a distributed Raman gain to the optical signals propagating along optical communication path 125. Raman amplifier 130 may include a known Raman amplifier or may include a Raman amplifier.

Banded SOAs ("BSOAs") 140 may include multiple SOA modules. SOA modules will be discussed below with reference to FIGS. 2, 3a, and 3b. BSOAs 140 can amplify optical signals in one or more wavelength bands (e.g., C-Band, L-Band, S-Band, O-band, E-Band, U-Band, etc.).

After being amplified by optical amplifiers 130, 140, the optical signals propagating along optical communication path 125 are next fed to demultiplexer 150 (e.g., DE-MUX), which may include a known optical decombiner, such as an AWG, de-interleaver, and/or one or more filters. Demultiplexer 150 may demultiplex one or more optical signals from optical communication path 125 into separate optical signals, each of which is supplied to a corresponding one of optical receivers 160-1 to 160-N (also referred to herein as "receivers 160"). Each receiver, in turn, may further separate or demultiplex each polarization component (TE and TM) included in each optical signal. The receiver may then convert each polarization component into a corresponding electrical signal, which is then further processed to demodulate the data stream carried by such polarization components. In one implementation, each of receivers 160-1 to 160-$n$ may be a coherent receiver.

Figure 2:
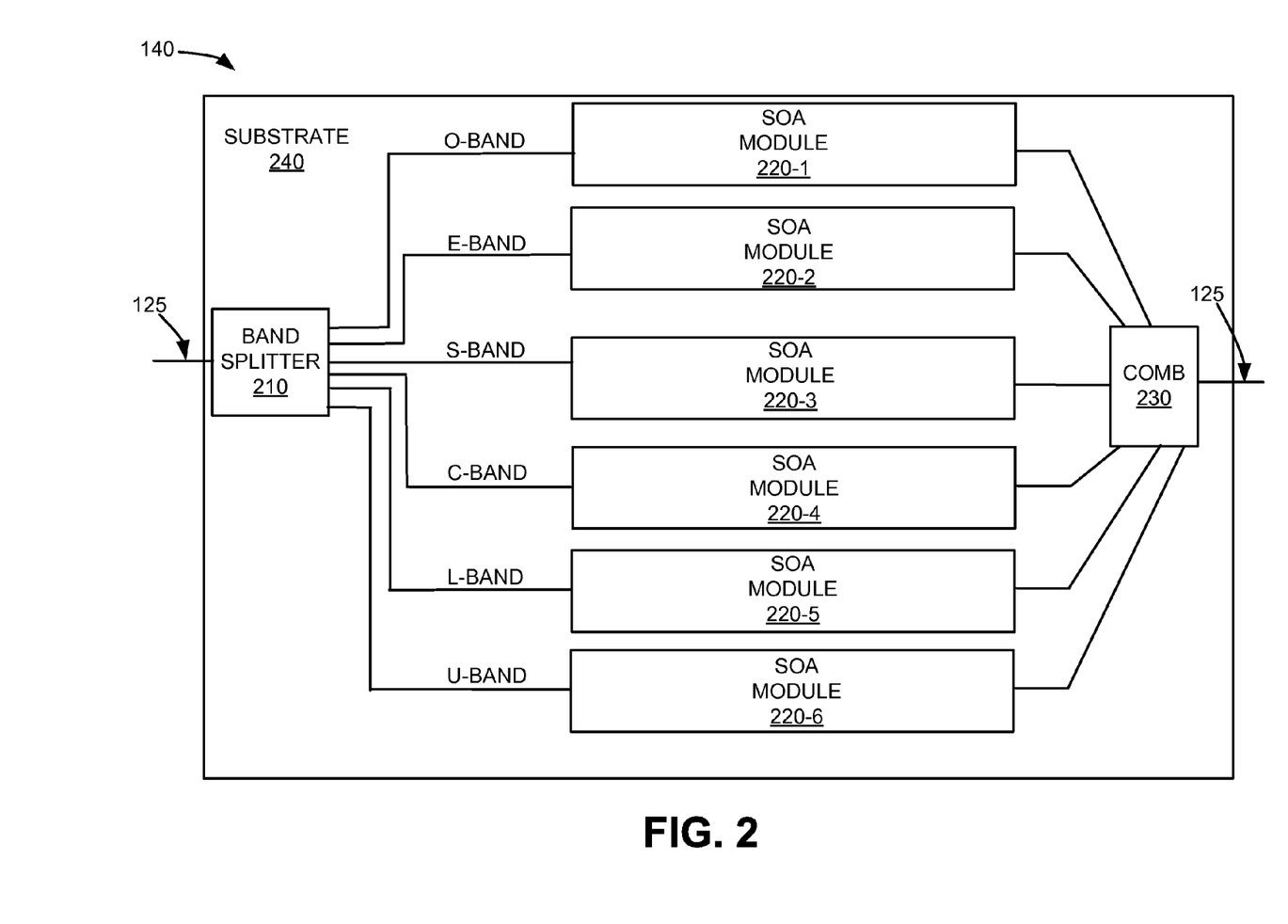
FIG. 2 is a diagram of an example banded semiconductor optical amplifier, as described herein.

As noted above, BSOAs 140 may be provided along optical communication path 125 in order to boost the power of optical signals, i.e., the WDM optical signal propagating along the optical path. FIG. 2 is a diagram of an example banded SOA 140 consistent with the present disclosure. BSOA 140 can include a band splitter 210, including one or more thin film filters, for example, that receives a WDM optical signal from optical communication path 125 and outputs bands of optical signals included in the WDM optical signal (e.g., the O-, E-, S-, C-, L, and U-bands) to corresponding SOA modules 220-1 to 220-6, in this example. In particular, optical signals in a known O-band are supplied to SOA module 220-1, while optical signals in a known E-band are supplied to SOA module 220-2. Similarly, optical signals in known S, C, L, and U-bands are supplied to each of respective SOA modules 220-3 to 220-6. Optical signals in the O-band have wavelengths in a range from about 1260 nm to about 1360 nm; optical signals in the E-band have wavelengths from about 1360 nm to about 1460 nm; optical signals in the S-band have wavelengths from about 1460 nm to 1530 nm; optical signals in the C-band 265 have wavelengths from about 1530 nm to about 1565 nm; optical signals in the L-band 270 have wavelengths from about 1565 nm to about 1625 nm; and optical signals in the U-band have wavelengths from about 1625 nm to about 1675 nm.

The optical signals in each band are then amplified by a corresponding of SOA module 220-1 to 220-6 and output to combiner 230, which combines the amplified outputs of modules 220 and supplies them to optical communication path 125 as a power-boosted WDM optical signal. Combiner 230 may be a known power combiner or other known multiplexer, which may include one or more thin film filters, for example.

Figure 3A:
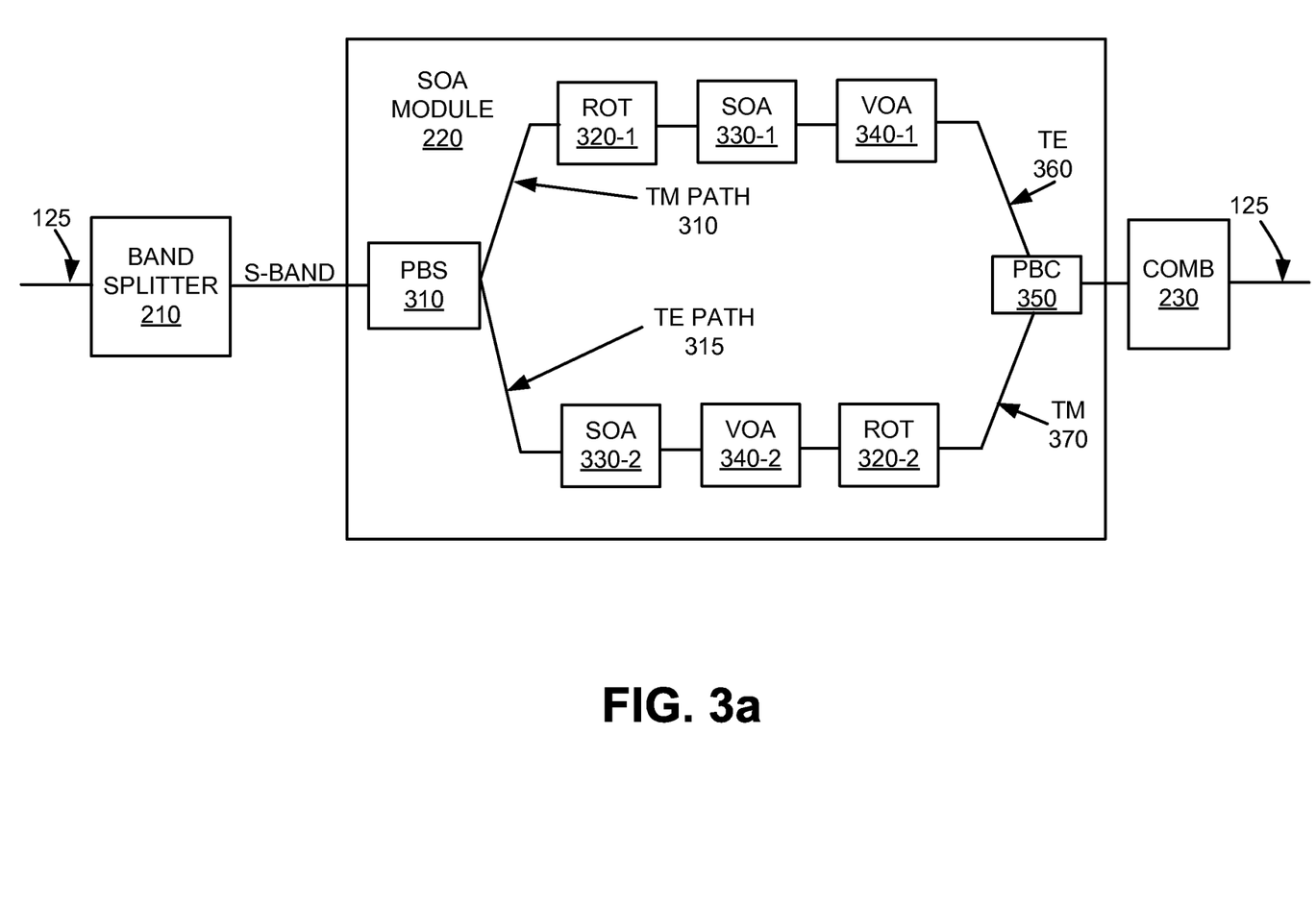
FIG. 3a is a diagram of an example of a semiconductor optical amplifier module consistent with an aspect of the present disclosure.

FIG. 3a shows SOA module 220-3 in greater detail. It is understood that remaining SOA modules 220-1, 220-2, and 220-4 to 220-6 have the same or similar construction as SOA module 220-3. As noted above SOA module 220-3 receives optical signals in the S-band from band splitter 210. Each of these optical signals, as further noted above, may have both TE and TM components.

Polarization beam splitter (PBS) 310 receives, in this example, optical signals having wavelengths in the S-band from band splitter 210, and supplies a component of each such optical signal having a TE polarization to TE path 315, and a component of each optical signal having a TM polarization to TM path 310. Rotator 320-1 provided along TM path 310 rotates the polarization of each of the TM components to provide optical signal components having a TE polarization. Such TE components are then amplified by a semiconductor optical amplifier 330-1, and then optionally attenuated by variable optical attenuator (VOA) 340-1 to provide desired power levels. The TE components (labeled 360) are then fed to polarization beam combiner 350.

As further shown in FIG. 3a, TE components output from PBS 310 to path 315 are supplied to SOA 330-2, which amplifies the TE components and outputs them to optional VOA 340-2, which may be provided to adjust the optical power of each TE component to a desired level. Next, rotator 320-2 rotates the polarization of the TE components, such that each component has a TM polarization. Such TM polarized components (labeled 370 in FIG. 3a) are combined with TE components 360 in polarization beam combiner 350 and supplied to combiner 230 along with the other amplified bands of the optical signals noted above.

Typically, semiconductor optical amplifiers, such as 330-1 and 330-2 preferentially amplify light having a TE polarization. Accordingly, the TM components output from PBS 310 are rotated by rotator 320-1 prior to amplification by SOA 330-1. On the other hand, the TE components output from PBS 310 already have a TE polarization and are therefore not rotated prior to amplification by SOA 330-2. In order to reduce interference between the TE components output from VOA 340-2 and TE components 360 in PBC 350, the TE components output from VOA 340-2 are rotated by rotator 320-2 to provide TM components 370, which have a polarization that is orthogonal to TE components 360.

Figure 3B:
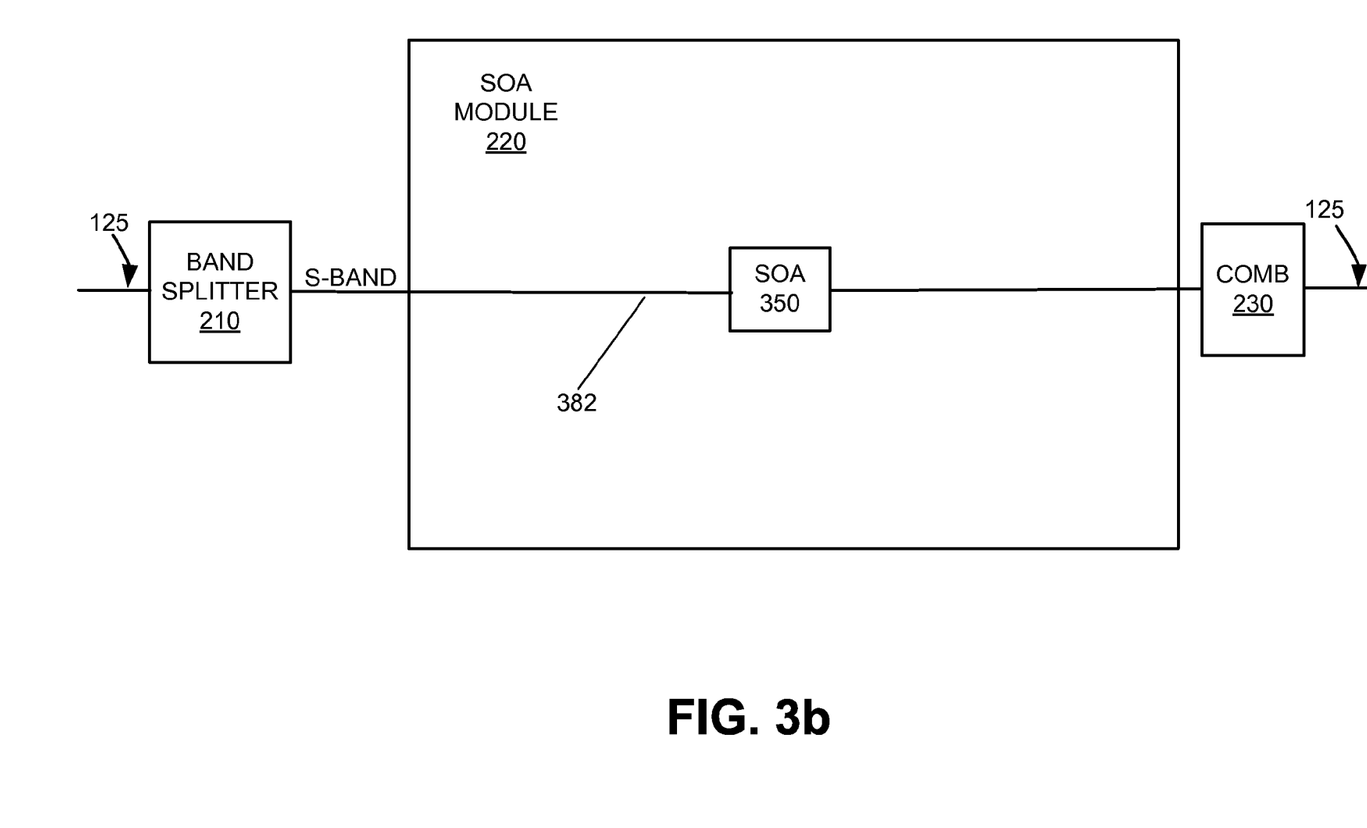
FIG. 3b is a diagram of a further example of a semiconductor optical amplifier module consistent with a further aspect of the present disclosure.

FIG. 3b illustrates a further example of SOA module 220. Here, SOA module 220 includes SOA 380 that receives S-band optical signals output from splitter 210. Preferably, SOA 380 is polarization insensitive. Accordingly, both TE and TM components of each optical signal may be supplied to the same SOA, e.g., SOA 380, and be amplified by substantially the same amount. As a result, PBS 310 and PBC 350 may be omitted, as well as the TM (310) and TE (315) paths, such that one path (382) supplies each S-band optical signal from band splitter 210 to amplifier 380 and inputs the resulting amplified signals to combiner 230. Other optical amplifier modules may include polarization insensitive SOAs to provide similar amplification of both TE and TM components of other bands output from band splitter 210 in a manner similar to that shown in FIG. 3b.

Other devices may be provided in TM path 310 and TE path 315. Preferably, however, the length (or optical length) and/or number of devices provided in each path should be the same or substantially the same such that the optical components (TE or TM) propagating in each path experience the same (or substantially the same) gain and/or loss. That is, since each device imparts a given amount of gain or loss to the optical components propagating along the path, the number of devices along each path should be the same so that the net gain or loss experienced by the optical components (TE or TM) propagating along one path is the same or substantially the same as that of the other path.

In the above example, VOAs 340-1 and 340-2 may have a structure, as described, for example, in U.S. Patent Application Publication No. 20100320370 and U.S. Pat. No. 7,539,365, the entire contents of both of which are incorporated herein by reference. In addition, exemplary rotators 320-1 and 320-2 are described, for example, in U.S. Patent Application Publication No. 2011/0150384, the entire contents of which are incorporated herein by reference. In addition, one example SOA 330 is described in U.S. Patent Application Publication U.S. 2009/0245719 A1 (application Ser. No. 12/058,652), the disclosure of which is incorporated by reference. Moreover, each SOA module may be provided on a common substrate 240, including indium phosphide (InP), for example. Alternatively, individual SOA modules may be provided on separate substrates and packaged separately from one another.

Further, if desired, certain bands of optical signals may be effectively be blocked by turning off or reducing the current or voltage to the SOAs in a selected SOA module.

A system and/or method, described herein, includes banded SOAs 140 that can provide amplification to multiple wavelength bands and multiple optical signal polarities. As provided herein, banded SOAs 140 can include SOA modules 220, which can include pairs of individual SOAs. SOA modules 220 can split optical signals into two separate polarizations, provide separate paths for amplifying TE polarized optical signals separately from TM polarized optical signals, rotate the TE polarized and TM polarized optical signals in the separate paths, and combine the TE polarized and TM polarized optical signals to provide an amplified optical signal including both TE polarized and TM polarized optical signals.

Optical amplifiers, as described above, may include devices that are integrated on a semiconductor substrate and may thus have a compact design. In addition, optical amplifiers consistent with the present disclosure may provide gain over multiple wavelength bands to realize increased capacity in a WDM optical communication system. Further, by appropriately biasing the SOAs in each module, a uniform or substantially uniform gain across each wavelength band can be obtained.

The foregoing description provides illustration and description, but is not intended to be exhaustive or to limit the implementations to the precise form disclosed. Modifications and variations are possible in light of the above disclosure or may be acquired from practice of the implementations.

Further, the terms "about" or "substantially" have been used throughout the description and is intended to mean the exact number or range that follows the term or a number within a particular threshold of the number or range that follows the term.

Also, while signals of particular example wavelengths have been described, one or more of these signals may have a different wavelength, or operate within a different range of wavelengths, in other implementations.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. An optical amplifier comprising:
   a substrate;
   a wavelength band splitter on the substrate, the wavelength band splitter configured to split an optical signal into a plurality of banded optical signals of particular wavelength bands;
   a plurality of semiconductor optical amplifier modules on the substrate, each of the plurality of semiconductor optical amplifier modules configured to amplify one of the plurality of banded optical signals of the particular wavelength bands from the wavelength band splitter into an amplified banded optical signal, and each of the plurality of semiconductor optical amplifier modules comprising:
      a polarized beam splitter configured to split the one of the plurality of banded optical signals into two polarization optical signals, a first polarization optical signal of the two polarization optical signals having only a first polarization and being provided along a first path of two separate optical paths, and a second polarization optical signal of the two polarization optical signals being provided along a second path of the two separate optical paths, the second polarization optical signal having only a second polarization,
      a first rotator along the first path, the first rotator configured to rotate a polarization of the first polarization optical signal to obtain a rotated first polarization optical signal, such that the rotated first polarization optical signal only has the second polarization, a first semiconductor optical amplifier configured to amplify the rotated first polarization optical signal to obtain an amplified first polarization optical signal, a first variable optical attenuator configured to adjust a power level, a phase, and/or an amplitude level of the amplified first polarization optical signal having only the second polarization to output a first resultant optical signal, a second semiconductor optical amplifier configured to amplify the second polarization optical signal to obtain an amplified second polarization optical signal, a second variable optical attenuator configured to adjust a power level, a phase, and/or an amplitude level of the amplified second polarization optical signal having only the second polarization to obtain an adjusted second polarization optical signal, a second rotator along the second path, the second rotator configured to rotate the polarization of the adjusted second polarization optical signal to output a second resultant optical signal, and a polarized beam combiner configured to combine the first resultant optical signal and the second resultant optical signal into the amplified banded optical signal; and a wavelength band combiner on the substrate, the wavelength band combiner configured to combine the amplified banded optical signals from each of the plurality of semiconductor optical amplifier modules into an amplified optical signal.

2. The optical amplifier of claim 1, where the wavelength band splitter comprises a bandpass filter configured to receive the optical signal, the optical signal having multiple wavelengths, and where the bandpass filter is configured to split the optical signal into a plurality of banded optical signals in one or more of O-band, E-band, S-band, C-band, L-band, or U-band.

3. The optical amplifier of claim 1, wherein the first polarization is a TM polarization and the second polarization is a TE polarization.

4. The optical amplifier of claim 1, where the first or the second variable optical attenuator comprises a Mach-Zehnder interferometer, and where:

the first variable optical attenuator is configured to adjust the power level, the phase, and/or the amplitude level of the amplified first polarization optical signal to balance with the power level, the phase, and/or the amplitude level of the amplified second polarization optical signal, or the second variable optical attenuator is configured to adjust the power level, the phase, and/or the amplitude level of the amplified second polarization optical signal to balance with the power level, the phase, and/or the amplitude level of the amplified first polarization optical signal.

5. The optical amplifier of claim 1, where the polarized beam combiner comprises a thin-film polarizer.

6. The optical amplifier of claim 1, where the wavelength band combiner comprises an optical filter or an arrayed waveguide grating (AWG).

7. The optical amplifier of claim 1, where the wavelength beam splitter comprises a Mach-Zehnder interferometer.

8. The optical amplifier of claim 1, where the first rotator or the second rotator comprises an asymmetric waveguide or a photonic bandgap structure.

9. An optical system comprising:

a plurality of transmitters configured to transmit a plurality of transmitted optical signals;

a multiplexer configured to receive and combine the plurality of transmitted optical signals into a multiplexed optical signal;

a plurality of optical amplifiers configured to amplify the multiplexed optical signal, one of the plurality of optical amplifiers comprising:

a wavelength band splitter, the wavelength band splitter configured to split the multiplexed optical signal into a plurality of banded optical signals of particular wavelength bands;

a plurality of modules configured to communicate with the wavelength band splitter and receive at least one of the plurality of banded optical signals, each of the plurality of modules configured to amplify one of the plurality of banded optical signals of the particular wavelength bands from the wavelength band splitter into an amplified banded optical signal, and one of the plurality of modules comprising:

a polarized beam splitter to split one of the plurality of banded optical signals into a pair of polarized optical signals, one of the pair of polarized optical signals having a first polarization and the other of the pair of polarized optical signals having a second polarization;

a plurality of semiconductor optical amplifiers each of which is configured to amplify an optical signal of the pair of polarized optical signals;

a plurality of rotators each of which is configured to rotate the other optical signal of the pair of polarized optical signals to have the first polarization; and a polarized beam combiner to combine the pair of amplified and rotated polarized optical signals into the amplified banded optical signal; and a wavelength band combiner on the substrate, the wavelength band combiner configured to combine the amplified banded optical signals from each of the plurality of modules into an amplified multiplexed optical signal;

a demultiplexer configured to decombine the amplified multiplexed optical signal into a plurality of amplified demultiplexed optical signals;

a plurality of receivers configured to receive the plurality of amplified demultiplexed optical signals;

a first device configured to adjust a power level, a phase, and/or an amplitude level of a first of the pair of amplified and rotated polarized optical signals before the first of the pair of amplified and rotated polarized optical signals is output to the polarized beam combiner, the first of the pair of amplified and rotated polarized optical signals having only the first polarization; and a second device configured to adjust a power level, a phase, and/or an amplitude level of a second of the pair of amplified and rotated polarized optical signals before the second of the pair of amplified and rotated polarized optical signals is output to the polarized beam combiner, the second of the pair of amplified and rotated polarized optical signals having only the first polarization, where the first device or the second device comprises a Mach-Zehnder interferometer.

10. The optical system of claim 9, further comprising a Raman amplifier configured to amplify the multiplexed optical signal or the amplified multiplexed optical signal.

11. The optical system of claim 9, where the first polarization is a Transverse Electric (TE) polarization and the second polarization is a Transverse Magnetic (TM) polarization.

12. The optical system of claim 9, where the wavelength band splitter comprises a bandpass filter configured to receive the multiplexed optical signal, the multiplexed optical signal having a plurality of wavelengths with a plurality of polarities, and where the bandpass filter is configured to split the multiplexed optical signal into a plurality of wavelength bands including one or more of O-band, E-band, S-band, C-band, L-band, or U-band, and where the wavelength band combiner comprises an optical filter or an arrayed waveguide grating (AWG) configured to combine the amplified banded optical signals from each of the plurality of modules, the amplified banded optical signals including amplified banded optical signals corresponding to multiple wavelength bands including one or more of the O-band, the E-band, the S-band, the C-band, the L-band, or the U-band.

* * * * *